(12) United States Patent
Lee

(10) Patent No.: US 8,502,355 B2
(45) Date of Patent: Aug. 6, 2013

(54) OVERLAY VERNIER MASK PATTERN, FORMATION METHOD THEREOF, SEMICONDUCTOR DEVICE INCLUDING OVERLAY VERNIER PATTERN, AND FORMATION METHOD THEREOF

(75) Inventor: Joon Seuk Lee, Yongin-si (KR)

(73) Assignee: SK Hynix Inc., Gyeonggi-do (KR)

( * ) Notice: Subject to any disclaimer, the term of this patent is extended or adjusted under 35 U.S.C. 154(b) by 25 days.

(21) Appl. No.: 13/315,742

(22) Filed: Dec. 9, 2011

(65) Prior Publication Data
US 2012/0146195 A1 Jun. 14, 2012

(30) Foreign Application Priority Data
Dec. 9, 2010 (KR) .................. 10-2010-0125808

(51) Int. Cl.
*H01L 23/58* (2006.01)
(52) U.S. Cl.
USPC .................. 257/635; 257/797; 257/E29.001; 257/E21.24
(58) Field of Classification Search
USPC ............... 257/635, 797, E29.001, E21.24
See application file for complete search history.

(56) References Cited

U.S. PATENT DOCUMENTS

| 7,190,823 | B2 | 3/2007 | Chen | |
|---|---|---|---|---|
| 7,638,263 | B2* | 12/2009 | Sim | 430/311 |
| 7,879,729 | B2* | 2/2011 | Jung | 438/703 |
| 2007/0292776 | A1* | 12/2007 | Cho et al. | 430/22 |
| 2009/0142932 | A1* | 6/2009 | Jung | 438/736 |
| 2009/0170330 | A1* | 7/2009 | Jung | 438/703 |

FOREIGN PATENT DOCUMENTS

| KR | 1020080034568 A | 4/2008 |
|---|---|---|
| KR | 1020090103520 A | 1/2009 |
| KR | 1020090019133 A | 2/2009 |
| KR | 1020090072672 A | 7/2009 |

* cited by examiner

*Primary Examiner* — Trung Q Dang
(74) *Attorney, Agent, or Firm* — William Park & Associates Patent Ltd.

(57) ABSTRACT

An overlay vernier mask pattern of a semiconductor device includes a first overlay vernier mask pattern having a first opening for exposing a first area of a layer to be etched on a substrate and a second opening for exposing a second area spaced apart from the first area, and a second overlay vernier mask pattern aligned on the first overlay vernier mask pattern and the layer to be etched, and having an opening for exposing the second opening while exposing a portion of the layer to be etched in the first area.

21 Claims, 11 Drawing Sheets

OVERLAY VERNIER MASK PATTERN, FORMATION METHOD THEREOF, SEMICONDUCTOR DEVICE INCLUDING OVERLAY VERNIER PATTERN, AND FORMATION METHOD THEREOF

CROSS-REFERENCES TO RELATED APPLICATIONS

The present application claims priority under 35 U.S.C 119(a) to Korean Application No. 10-2010-0125808, filed on Dec. 9, 2010, in the Korean intellectual property Office, which is incorporated herein by reference in its entirety.

BACKGROUND

Exemplary embodiments of the present invention relate to a semiconductor device and a fabricating method thereof, and more particularly, to an overlay vernier mask pattern of a semiconductor device, a formation method thereof, a semiconductor device including an overlay vernier pattern, and a formation method thereof.

In the fabrication process of a semiconductor integrated circuit, various processes such as masking, resist coating, etching, and stacking are performed. When performing the processes, a specific material layer may overlap a layer existing below the material layer, or may also be removed to prevent overlap from the material layer. In such a process, it is very important to appropriately align upper and lower process layers. In the fabrication process of a semiconductor device, registration is generally used for measuring the accuracy of inter-layer alignment. Registration is accomplished by allowing a matching pattern formed on an existing layer to overlap a distinct pattern distinguished from the matching pattern and comparing the position of the existing layer with the position of a subsequent layer. That is, by measuring the distance between an alignment mark of the subsequent layer and an alignment mark of the existing layer, misalignment between the two layers can be measured. A registration structure mainly used at the present time includes box-in-box overlay vernier, bar-in-bar overlay vernier, and the like.

However, as the integration degree of a semiconductor device increased, pitch between patterns is reduced. Patterns with a narrow pitch are not formed through a one-time photolithography process due to the limitation of a photolithography process. Rather, a dual patterning technology (DPT) has been used to form patterns with a narrow pitch by performing the photolithography process twice. The dual patterning technology is also applied to cases where, although patterns may be aligned in a peripheral circuit area with a relatively sufficient pitch, those patterns are not normally formed through a single photolithography. The dual patterning technology may also be applied to a cell area where predetermined type of patterns, for example, line and space type of patterns are aligned.

A process for forming a micro pattern by using the dual patterning technology will be briefly described below. First mask patterns are formed on a layer to be patterned through a first patterning process. A pitch between the first mask patterns is approximately twice as long as the pitch according to a design rule. Second mask patterns aligned between the first patterns are formed through a second patterning process. A lower layer to be patterned is etched through an etching process using the first mask patterns and the second mask patterns as etching masks, thereby forming micro patterns with the pitch according to the design rule. As described above, since the dual patterning technology forms mask patterns by performing a patterning process twice, a triple key is used in registration for checking alignment between upper and lower layers. That is, in the first patterning process for forming the first mask patterns, a first overlay vernier mask pattern for forming a first overlay vernier pattern is formed, and in the second patterning process for forming the second mask patterns, a second overlay vernier mask pattern is formed. An etching process is performed using the first overlay vernier mask pattern and the second overlay vernier mask pattern as etching masks, thereby forming first and second overlay vernier patterns. The first and second overlay vernier patterns are used as an outer bar and an overlay vernier pattern formed above through a subsequent process is used as an inner box, thereby recognizing an alignment relationship between upper and lower layers.

However, in such a process, an opening formed in the first overlay vernier mask pattern formed below may be covered by the second overlay vernier mask pattern formed above the first overlay vernier mask pattern. In such a case, although an etching process is performed using the first overlay vernier mask pattern and the second overlay vernier mask pattern as etching masks, the first overlay vernier pattern, which is to be formed by the first overlay vernier mask pattern, may not be formed. In addition, an opening formed in the second overlay vernier mask pattern may also overlap the first overlay vernier mask pattern formed below the second overlay vernier mask pattern. In such a case, since the first overlay vernier mask pattern serves as an etching barrier, the second overlay vernier pattern, which is to be formed by the second overlay vernier mask pattern, may not be normally formed.

SUMMARY

An embodiment of the present invention relates to an overlay vernier mask pattern of a semiconductor device, which allows a first overlay vernier pattern based on a first overlay vernier mask pattern formed below and a second overlay vernier pattern based on a second overlay vernier mask pattern formed above to be normally formed when using a triple key by employing a dual patterning technology, and a formation thereof.

Another embodiment of the present invention relates to a semiconductor device including an overlay vernier pattern and a formation method thereof.

In one embodiment, an overlay vernier mask pattern of a semiconductor device includes: a first overlay vernier mask pattern having a first opening for exposing a first area of a layer to be etched and a second opening for exposing a second area spaced apart from the first area; and a second overlay vernier mask pattern aligned on the first overlay vernier mask pattern and the layer to be etched, and having an opening for exposing the second opening while exposing a portion of the layer to be etched in the first area.

The layer to be etched may include an amorphous carbon layer (ACL) and a silicon oxynitride layer (SiON).

The first overlay vernier mask pattern may include a polysilicon layer.

The first opening of the first overlay vernier mask pattern may have a box shape. In such a case, the second opening of the first overlay vernier mask pattern may have a bar shape while being aligned in parallel to each side of the first opening.

The second overlay vernier mask pattern may include an insulation layer formed by a spin-on coating (SOC) method.

A portion of the second overlay vernier mask pattern may overlap the first overlay vernier mask pattern between the first opening and the second opening.

The opening of the second overlay vernier mask pattern may be aligned in the first area.

In another embodiment, a semiconductor device includes a substrate including a cell area and an overlay vernier area; a layer to be etched aligned on the substrate; a first cell mask pattern and a second cell mask pattern aligned on the layer to be etched of the cell area; a first overlay vernier mask pattern having a first opening for exposing a first area of a layer to be etched of the overlay vernier area and a second opening for exposing a second area spaced apart from the first area; and a second overlay vernier mask pattern aligned on the first overlay vernier mask pattern and the layer to be etched of the overlay vernier area, and having an opening for exposing the second opening while exposing a portion of the layer to be etched in the first area.

The first cell mask pattern and the first overlay vernier mask pattern may each include a respective material pattern, which are substantially equal to each other.

The first cell mask pattern and the first overlay vernier mask pattern may each include a respective polysilicon pattern.

The second cell mask pattern and the second overlay vernier mask pattern may each include a respective material pattern, which are substantially equal to each other.

The second cell mask pattern and the second overlay vernier mask pattern may each include a respective SOC pattern.

In another embodiment, a method for forming an overlay vernier mask pattern of a semiconductor device includes: forming a first overlay vernier mask pattern on a layer to be etched on a substrate by performing a first patterning process of a dual patterning process, the first overlay vernier mask pattern having a first opening for exposing a first area of the layer to be etched and a second opening for exposing a second area spaced apart from the first area; and forming a second overlay vernier mask pattern by performing a second patterning process of the dual patterning process, the second overlay vernier mask pattern having an opening for exposing the second opening on the first overlay vernier mask pattern and the layer to be etched while exposing a portion of the layer to be etched in the first area.

The first overlay vernier mask pattern may be formed in a box structure and the second opening of the first overlay vernier mask pattern and the opening of the second overlay vernier mask pattern may each be formed in a bar structure.

In another embodiment, a method for forming a semiconductor device includes: forming a layer to be etched on a substrate including a cell area and an overlay vernier area; forming a first mask layer on the layer to be etched; forming a first cell mask pattern and a first overlay vernier mask pattern in the cell area and the overlay vernier area by patterning the first mask layer through a first patterning process of a dual patterning process, the first overlay vernier mask pattern having a first opening for exposing a first area of the layer to be etched and a second opening for exposing a second area spaced apart from the first area; forming a second mask layer on the first cell mask pattern and the first overlay vernier mask pattern; forming a second cell mask pattern in the cell area where the first cell mask pattern and the second cell mask pattern are alternately aligned, and forming a second overlay vernier mask pattern in the overlay vernier area by patterning the second mask layer through a second patterning process of the dual patterning process, the second overlay vernier mask pattern having an opening for exposing the second opening while exposing a portion of the layer to be etched in the first area; and removing an exposed portion of the layer to be etched by using the first cell mask pattern, the second cell mask pattern, the first overlay vernier mask pattern and the second overlay vernier mask pattern as etching masks, thereby forming a cell mask pattern and an overlay vernier pattern in the cell area and the overlay vernier area, respectively.

The layer to be etched may be formed by sequentially stacking an amorphous carbon layer, a first silicon oxynitride layer, a first polysilicon layer, and a second silicon oxynitride layer.

The first mask layer may include a material having a sufficient etching selectivity relative to the second silicon oxynitride layer to perform as an etch buffer layer to the second silicon oxynitride layer. In such a case, the first mask layer may include a second polysilicon layer.

The second mask layer may include a material having a sufficient etching selectivity relative to the second silicon oxynitride layer to perform as an etch buffer layer to the second silicon oxynitride layer. In such a case, the second mask layer may include an amorphous carbon layer.

The first opening and the second opening of the first overlay vernier mask pattern may have a box structure and a bar structure, respectively.

The opening of the second overlay vernier mask pattern may have a bar structure.

The opening of the second may overlay vernier mask pattern overlaps the first opening of the first overlay vernier mask pattern.

BRIEF DESCRIPTION OF THE DRAWINGS

The above and other aspects, features and other advantages will be more clearly understood from the following detailed description taken in conjunction with the accompanying drawings, in which.

DESCRIPTION OF SPECIFIC EMBODIMENTS

Hereinafter, embodiments of the present invention will be described with reference to accompanying drawings. However, various embodiments are for illustrative purposes only and are not intended to limit the scope of the invention.

Figure 1:
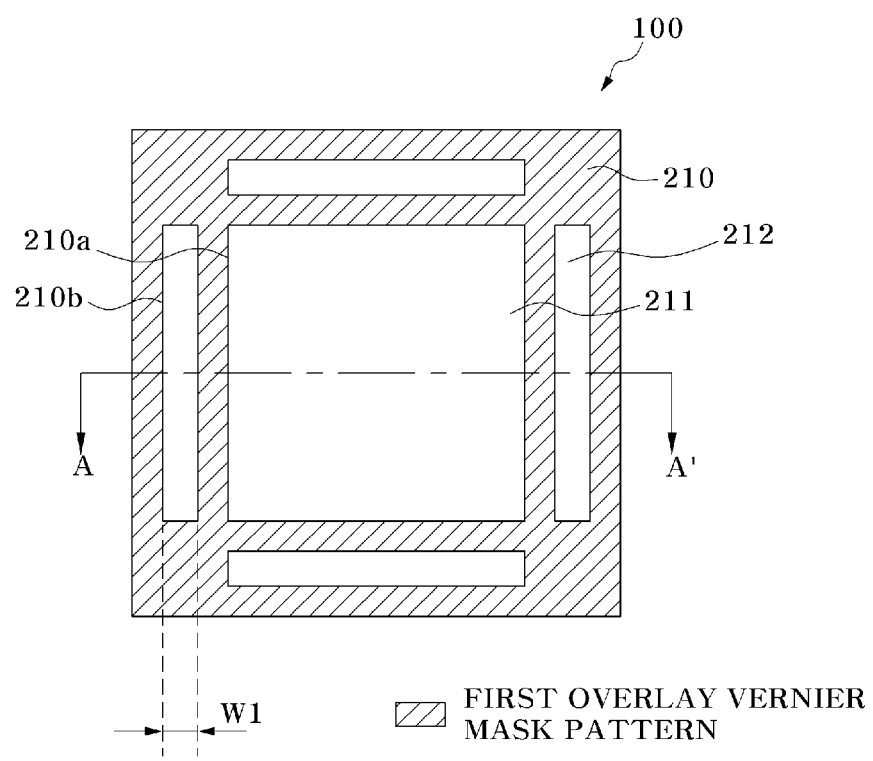
FIG. 1 is a plan view illustrating a first overlay vernier mask pattern constituting an overlay vernier mask pattern of a semiconductor device according to an embodiment of the present invention.
Figure 2:
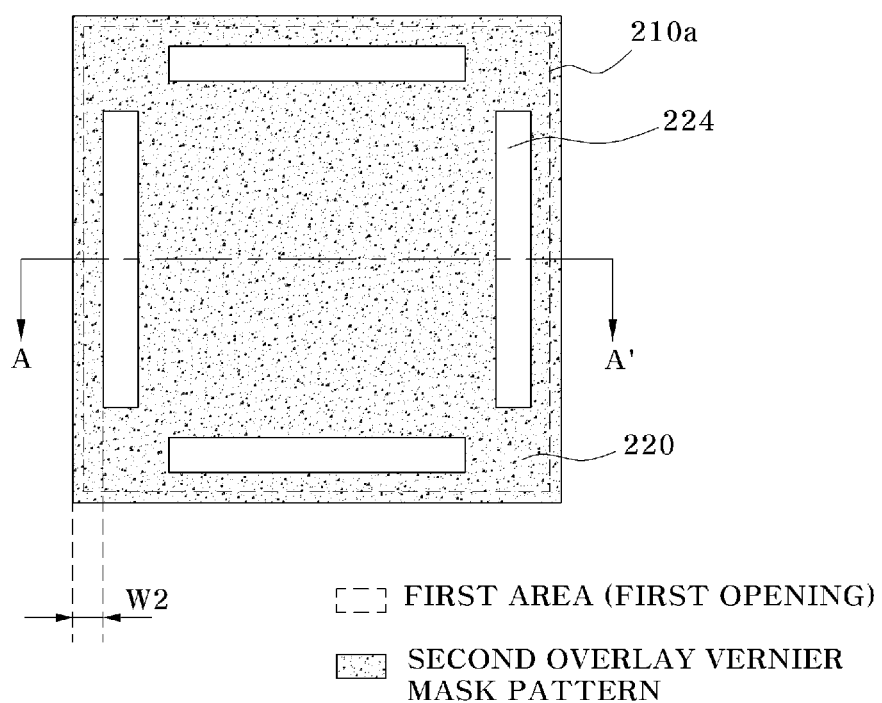
FIG. 2 is a plan view illustrating a second overlay vernier mask pattern constituting an overlay vernier mask pattern of a semiconductor device according to an embodiment of the present invention.
Figure 3:
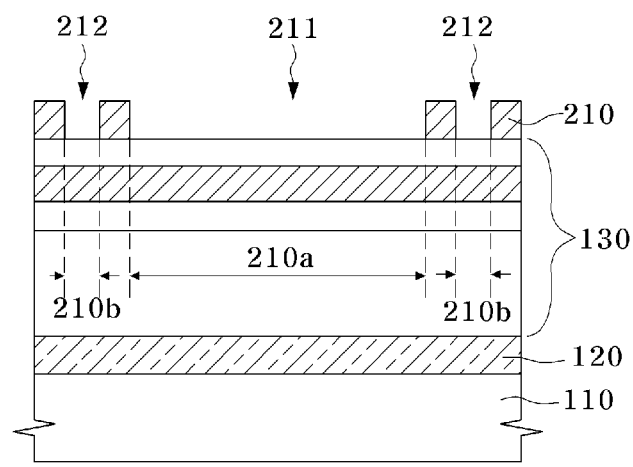
FIG. 3 is a sectional view taken along line A-A' of FIG. 1.
Figure 4:
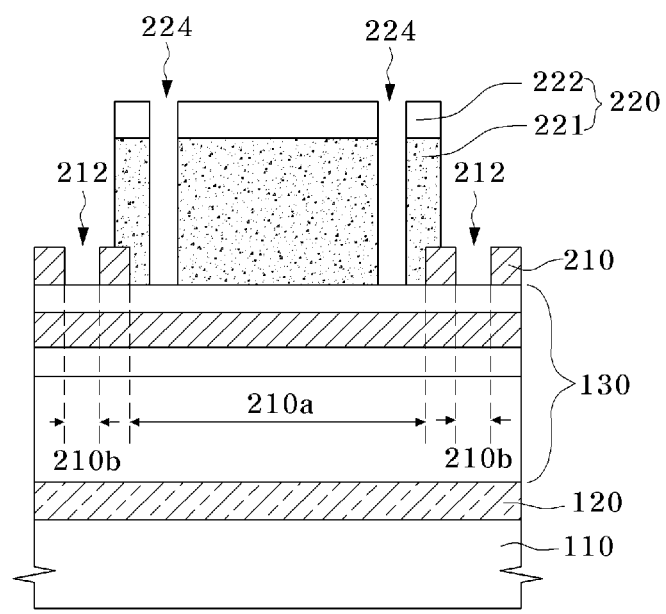
FIG. 4 is a sectional view taken along line A-A' of FIG. 2.

An overlay vernier mask pattern according to an embodiment of the present invention includes a first overlay vernier mask pattern and a second overlay vernier mask pattern. The first overlay vernier mask pattern is formed in the primary patterning when performing patterning using a dual patterning technology, and the second overlay vernier mask pattern is formed in the secondary patterning. That is, after the first overlay vernier mask pattern is formed, the second overlay vernier mask pattern is formed. FIG. 1 illustrates a planar structure of the first overlay vernier mask pattern and FIG. 2 illustrates a planar structure of the second overlay vernier mask pattern. FIG. 3 is a sectional view taken along line A-A' of FIG. 1, which illustrates only the first overlay vernier mask pattern. FIG. 4 is a sectional view taken along line A-A' of FIG. 2, which illustrates both the first overlay vernier mask pattern and the second overlay vernier mask pattern.

Referring to FIGS. 1 and 3, a first overlay vernier mask pattern 210 includes a first opening 211 for exposing a first area 210a of a lower layer 130 and a second opening 212 for exposing a second area 210b of the lower layer 130. The second area 210b indicates an area where a first overlay vernier pattern is to be formed and the first area 210a includes an area where a second overlay vernier pattern is to be formed. In an embodiment, the first opening 211 for exposing the first area 210a has a box shape and the second opening 212 for exposing the second area 210b has a bar shape. The second opening 212 is elongated along each side of the first opening 211 while being spaced apart from the first opening 211 by a predetermined interval. The width w1 of the second opening 212 having the bar shape may be set from approximately 0.1 µm to approximately 3 µm. The length of the second opening 212 may be set to be substantially equal to the length of the side of the first opening 211, although other lengths may also be used.

A portion of the lower layer 130 aligned below the first overlay vernier mask pattern 210 is removed through an etching process using the first overlay vernier mask pattern 210 as an etching mask to cause the generation of an overlay vernier pattern, and has a structure in which a plurality of layers is stacked. The lower layer 130 is aligned on a layer 120 to be patterned. The layer 120 to be patterned may be a layer which is to be finally patterned, or a hard mask layer as is required. In an embodiment, the layer 120 to be patterned may be a hard mask layer for patterning a bit line. In an embodiment, an interlayer dielectric layer (not shown) and a bit line (not shown) are aligned between the layer 120 to be patterned and a substrate 110. In an embodiment, the first overlay vernier mask pattern 210 may be formed of a polysilicon layer.

Referring to FIGS. 2 and 4, a second overlay vernier mask pattern 220 is aligned on the first overlay vernier mask pattern 210 and the lower layer 130. The second overlay vernier mask pattern 220 has a box structure by which the first opening 211 of the first overlay vernier mask pattern 210 is covered and the second opening 212 thereof is exposed. The second overlay vernier mask pattern 220 has a bar-shaped opening 224 which is elongated along each side of a box in the box. Thus, the opening 224 is aligned in the first area 210a to partially expose the surface of the lower layer 130. Furthermore, as the second overlay vernier mask pattern 220 is aligned such that the second opening 212 of the first overlay vernier mask pattern 210 is exposed, the surface, which is exposed through the second opening 212 of the first overlay vernier mask pattern 210, of the lower layer 130 on the second area 210b is maintained in an exposed state. Consequently, when an etching process is performed with respect to the lower layer 130 by using the first overlay vernier mask pattern 210 and the second overlay vernier mask pattern 220 as etching masks, the etching process is normally performed with respect to the portion exposed through the second opening 212 of the first overlay vernier mask pattern 210 causing the generation of a first overlay vernier pattern. Similarly to this, an etching process is normally performed with respect to a portion exposed through the opening 224 of the second overlay vernier mask pattern 220 causing the generation of a second overlay vernier pattern. A width w2 between the opening 224 of the second overlay vernier mask pattern 220 and the edge may be set from approximately 0.1 µm to approximately 3 µm.

Figure 5:
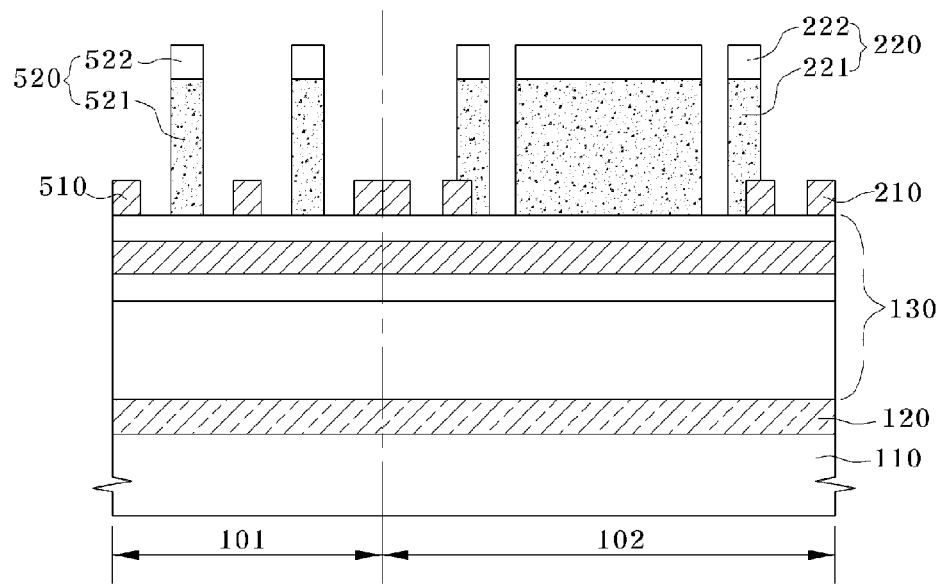
FIG. 5 is a sectional view illustrating both an overlay vernier mask pattern and a cell mask pattern according to an embodiment of the invention.

FIG. 5 is a sectional view illustrating both an overlay vernier mask pattern and a cell mask pattern according to an embodiment of the invention. Referring to FIG. 5, the layer 120 to be patterned and the lower layer 130 are sequentially aligned on the substrate 110 including a cell area 101 and an overlay vernier area 102. The lower layer 130 has a structure in which a plurality of layers is stacked. The lower layer 130 is etched through an etching process using a first cell hard mask pattern and a second hard mask pattern, which are formed in the cell area 101, and a first overlay vernier mask pattern and a second overlay vernier mask pattern, which are formed in the overlay vernier area 102, as etching masks. In an embodiment, the lower layer 130 may have a structure in which an amorphous carbon layer ACL, a first silicon oxynitride layer, a first polysilicon layer, and a second silicon oxynitride layer are sequentially stacked.

A first cell mask pattern 510 and a second hard mask pattern 520 are aligned on the cell area 101. The first cell mask pattern 510 may be formed of a polysilicon pattern. The second hard mask pattern 520 may have a structure in which an SOC pattern 521 and a third silicon oxynitride layer 522 are sequentially stacked. The first overlay vernier mask pattern 210 and the second overlay vernier mask pattern 220 are aligned in the overlay vernier area 102. The first overlay vernier mask pattern 210 may be formed of a polysilicon pattern, similarly to the first cell mask pattern 510. The second overlay vernier mask pattern 220 may have a structure in which an SOC pattern 221 and a third silicon oxynitride layer 222 are sequentially stacked, similarly to the second hard mask pattern 520.

The first cell mask pattern 510 of the cell area 101 and the first overlay vernier mask pattern 210 of the overlay vernier area 102 may be formed in the primary patterning process of the dual patterning process. The second hard mask pattern 520 of the cell area 101 and the second overlay vernier mask pattern 220 of the overlay vernier area 102 formed in the secondary patterning process of the dual patterning process. The first cell mask pattern 510 and the second hard mask pattern 520 may have a bar shape. However, the invention is not necessarily limited thereto. The first overlay vernier mask pattern 210 and the second overlay vernier mask pattern 220 may have the same shape as that described with reference to FIGS. 1 to 4.

Figure 6:
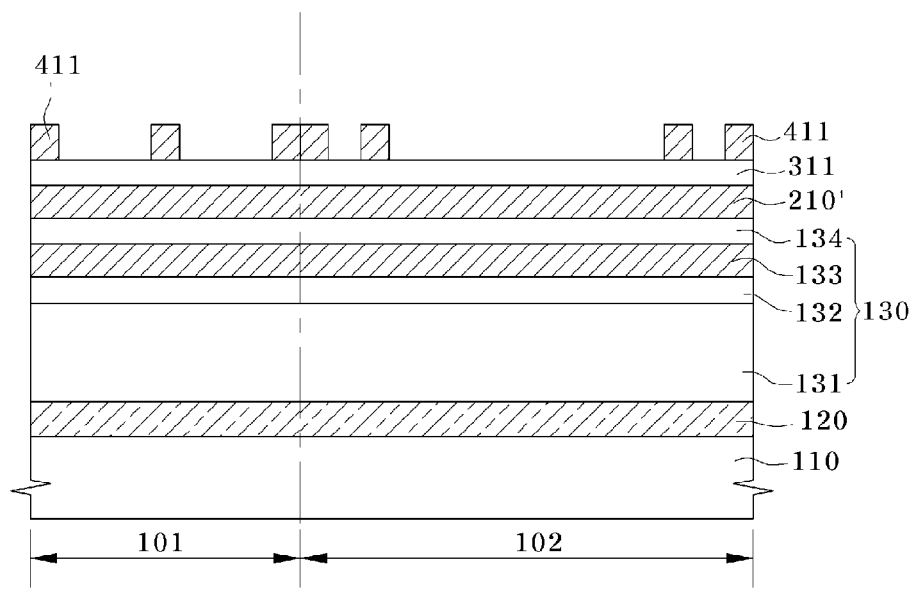
FIGS. 6 to 12 are sectional views explaining a method for forming an overlay vernier pattern using an overlay vernier mask pattern according to an embodiment of the invention.

FIGS. 6 to 12 are sectional views explaining a method for forming an overlay vernier mask pattern and a method for forming an overlay vernier pattern using an overlay vernier mask pattern according to an embodiment of the invention. In FIGS. 6 to 12, the same reference numerals are used to designate the same elements as those of FIGS. 1 to 5. Referring to FIG. 6, the layer 120 to be patterned is formed on the substrate 110 including the cell area 101 and the overlay vernier area 102. In the cell area 101 of the substrate 110, cell patterns formed by the dual patterning technology are aligned. In the overlay vernier area 102 of the substrate 110, overlay vernier patterns formed by the dual patterning technology are aligned. In an embodiment, the layer 120 to be patterned may be a nitride layer. However, the invention is not limited thereto. Although not shown in the drawings, other material layers, for example, a bit line metal layer (not shown), may also be aligned between the substrate 110 and the layer 120 to be patterned. In such a case, the layer 120 to be patterned is used as a hard mask layer for patterning the bit line metal layer.

After forming the layer 120 to be patterned, the lower layer 130 is formed thereon. The lower layer 130 is etched through an etching process using the first cell hard mask pattern and the second hard mask pattern, which are formed in the cell area 101, and the first overlay vernier mask pattern and the second overlay vernier mask pattern, which are formed in the overlay vernier area 102, as etching masks. The lower layer 130 includes a plurality of layers. In an embodiment, the lower layer 130 is formed to have a structure in which an amorphous carbon layer (ACL) 131, a first silicon oxynitride (SiON) layer 132, a first polysilicon layer 133, and a second silicon oxynitride (SiON) layer 134 are sequentially stacked. In an embodiment, the amorphous carbon layer (ACL) 131 is formed with a thickness of approximately 2000 Å. The first silicon oxynitride layer 132 and the first polysilicon layer 133 are each formed with a thickness of approximately 400 Å. The second silicon oxynitride layer 134 is formed with a thickness of approximately 300 Å.

After forming the lower layer 130, a first mask layer 210' is formed on the lower layer 130. The first mask layer 210' is formed of a material having a sufficient etching selectivity relative to the second silicon oxynitride layer 134. This is because the first mask layer 210' needs to serve as an etch buffer layer while an exposed portion of the second silicon oxynitride layer 134 is being etched in a subsequent etching process. In an embodiment, the first mask layer 210' may be formed of a polysilicon layer having a thickness of approximately 300 Å. A first anti-reflection layer 311 is formed on the first mask layer 210'. A first photoresist pattern 411 is formed on the first anti-reflection layer 311. The first photoresist pattern 411 formed in the cell area 101 is used to form the first cell mask pattern for forming the cell pattern, and the first photoresist pattern 411 formed in the overlay vernier area 102 is used to form the first overlay vernier mask pattern. The first photoresist pattern 411 may be formed by forming a photoresist layer on the first anti-reflection layer 311 and performing an exposure and development process with respect to the photoresist layer.

Figure 7:
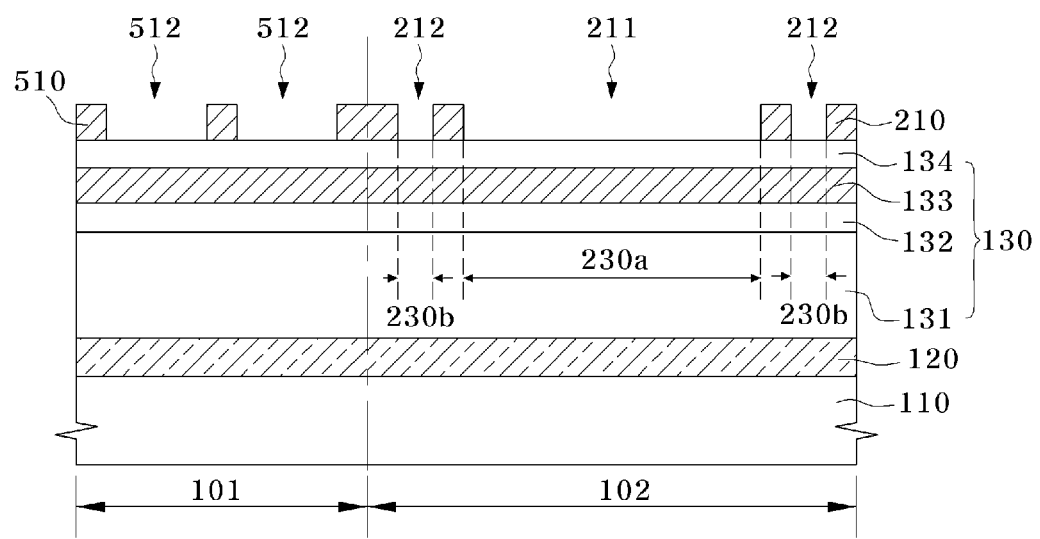

Exposed portions of the first anti-reflection layer 311 and the first mask layer 210' are sequentially etched using the first photoresist pattern 411 as an etching mask, and the first photoresist pattern 411 is removed. The first anti-reflection layer 311 remaining in the process of removing the first photoresist pattern 411 is also removed. As a result of the etching, as shown in FIG. 7, the first cell mask pattern 510 is formed in the cell area 101 and the first overlay vernier mask pattern 210 is formed in the overlay vernier area 102. The first cell mask pattern 510 formed on the cell area 101 has an opening 512 for partially exposing the surface of the second silicon oxynitride layer 134 formed below, and the second cell mask pattern formed through the subsequent secondary patterning process is aligned in an area exposed by the opening 512. The first overlay vernier mask pattern 210 formed in the overlay vernier area 102 has an opening 211 and an opening 212 for partially exposing the surface of the second silicon oxynitride layer 134 formed below, and the second overlay vernier mask pattern formed through the subsequent secondary patterning process is aligned in an area overlapping the opening 211 while not overlapping the opening 212.

Figure 8:
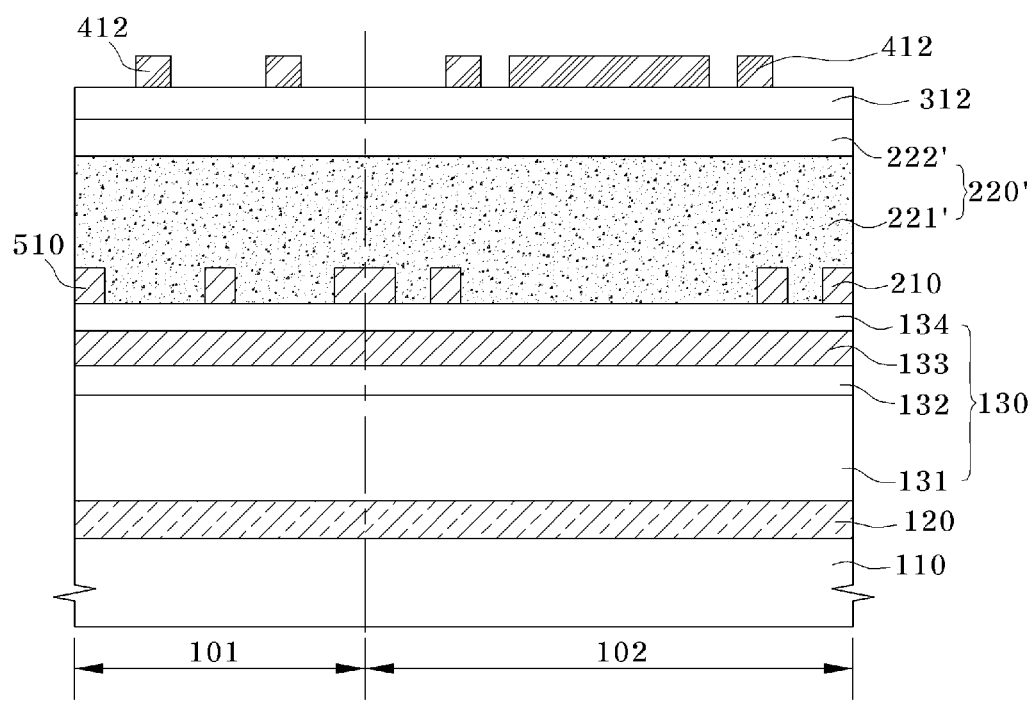

Referring to FIG. 8, after forming the first cell mask pattern 510 and the first overlay vernier mask pattern 210, a second mask layer 220' is formed on a resultant structure including the first cell mask pattern 510 and the first overlay vernier mask pattern 210. The second mask layer 220' may need to have a sufficient etching selectivity relative to the second silicon oxynitride layer 134, and include a material having a sufficient etching selectivity relative to the first cell mask pattern 510 and the first overlay vernier mask pattern 210. This is because the second mask layer 220' also needs to serve as an etch buffer layer, similarly to the first mask layer 210', while the exposed portion of the second silicon oxynitride layer 134 is being etched in the subsequent etching process.

Furthermore, in the process of removing the second mask layer 220', the first cell mask pattern 510 and the first overlay vernier mask pattern 210 should not be affected much by the process. When the first cell mask pattern 510 and the first overlay vernier mask pattern 210 are formed of a polysilicon layer, the second mask layer 220' may be formed to have a structure in which an SOC layer 221' having a thickness of approximately 1000 Å and a third silicon oxynitride layer 222' having a thickness of approximately 300 Å are sequentially stacked. A second anti-reflection layer 312 is formed on the second mask layer 220' and a second photoresist pattern 412 is formed on the second anti-reflection layer 312. The second photoresist pattern 412 formed in the cell area 101 is used to form the second cell mask pattern, and the second photoresist pattern 412 formed in the overlay vernier area 102 is used to form the second overlay vernier mask pattern.

Figure 9:
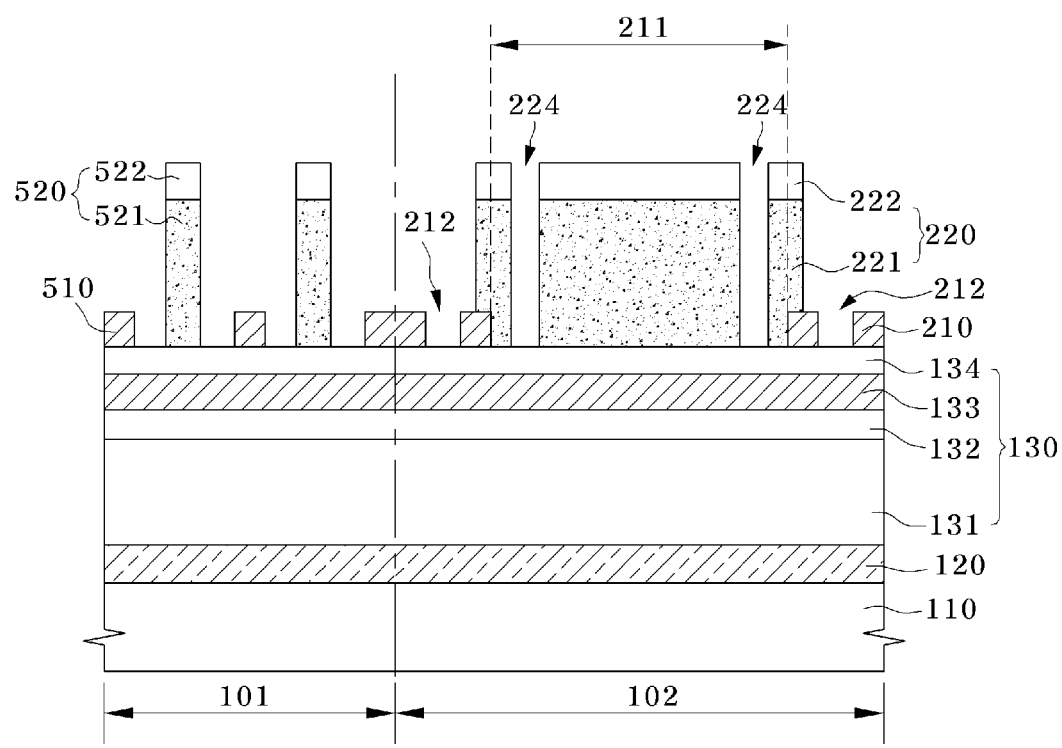

Exposed portions of the second anti-reflection layer 312 and the second mask layer 220' are sequentially etched using the second photoresist pattern 412 as an etching mask, after which the second photoresist pattern 412 is removed. The second anti-reflection layer 312 remaining in the process of removing the second photoresist pattern 412 is also removed. Referring to FIG. 9, the second cell hard mask pattern 520 is formed in the cell area 101 and the second overlay vernier mask pattern 220 is formed in the overlay vernier area 102 as a result of the etching. The second cell hard mask pattern 520 has a structure in which the SOC pattern 521 and the third silicon oxynitride layer 522 are sequentially stacked. Similarly to this, the second overlay vernier mask pattern 220 has a structure in which the SOC pattern 221 and the third silicon oxynitride layer 222 are sequentially stacked. The second cell hard mask pattern 520 formed in the cell area 101 and the first cell mask pattern 510 are aligned in the cell area 101. The second overlay vernier mask pattern 220 has the opening 224, and also exposes the second opening 212 of the first overlay vernier mask pattern 210 while overlapping the first opening 211 of the first overlay vernier mask pattern 210.

Figure 10:
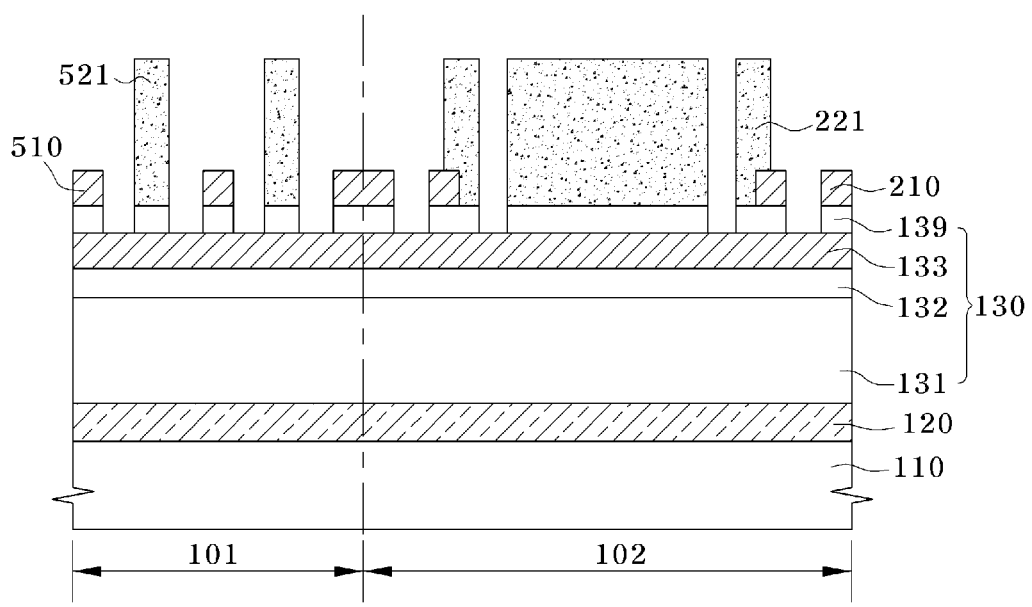

The exposed portion of the second silicon oxynitride layer 134 is etched using the first cell mask pattern 510, the second cell hard mask pattern 520, the first overlay vernier mask pattern 210 and the second overlay vernier mask pattern 220 as etching masks, thereby forming a second silicon oxynitride pattern 139 as shown in FIG. 10. In the process of forming the second silicon oxynitride pattern 139, the third silicon oxynitride layer 522 on the SOC pattern 521 in the cell area 101 and the third silicon oxynitride layer 222 on the SOC pattern 221 in the overlay vernier area 102 are removed.

Figure 11:
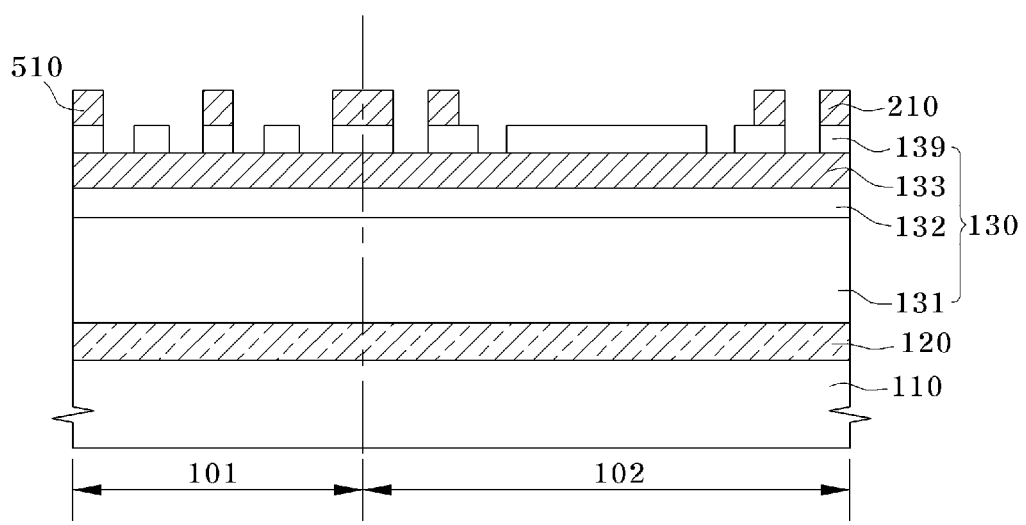

The SOC pattern 521 in the cell area 101 and the SOC pattern 221 in the overlay vernier area 102 are removed, thereby exposing the second silicon oxynitride pattern 139 covered by the SOC pattern 521 in the cell area 101 and simultaneously exposing the first overlay vernier mask pattern 210 and the second silicon oxynitride pattern 139 covered by the SOC pattern 221 in the overlay vernier area 102, as shown in FIG. 11.

Figure 12:
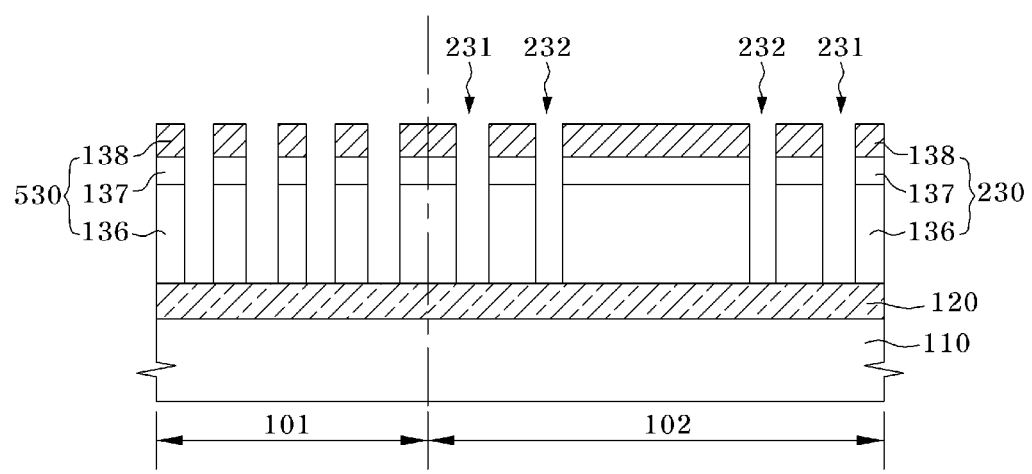

As shown in FIG. 12, an exposed portion of the first polysilicon layer 133 is removed by performing an etching process using the second silicon oxynitride pattern 139 as an etch buffer layer. Thus, a first polysilicon pattern 138 is aligned under the second silicon oxynitride pattern 139. Since the first cell mask pattern 510 and the first overlay vernier mask pattern 210 are formed of a polysilicon layer, the first cell mask pattern 510 on the second silicon oxynitride pattern 139 in the cell area 101 and the first overlay vernier mask pattern 210 on the second silicon oxynitride pattern 139 in the overlay vernier area 102 are removed in the etching process of removing the exposed portion of the first polysilicon layer 133.

An exposed portion of the first silicon oxynitride layer 132 is removed by performing an etching process using the first polysilicon pattern 138 as an etch buffer layer. Thus, a first silicon oxynitride layer 137 is aligned under the first polysilicon pattern 138. In the process of removing the exposed portion of the first silicon oxynitride layer 132, the second silicon oxynitride pattern 139 on the first polysilicon pattern 138 is removed. An exposed portion of the amorphous carbon layer 131 is removed by performing an etching process using the first polysilicon pattern 138 and the first silicon oxynitride layer 137 as etching masks, thereby forming an amorphous carbon pattern 136. Thus, in the cell area 101, a cell mask pattern 530 including the amorphous carbon pattern 136, the first silicon oxynitride layer 137 and the first polysilicon pattern 138 is formed. Similarly to this, in the overlay vernier area 102, an overlay vernier pattern 230 including the amorphous carbon pattern 136, the first silicon oxynitride layer 137 and the first polysilicon pattern 138 sequentially stacked is formed. The overlay vernier pattern 230 has an opening 231 corresponding to the second opening 212 (in FIG. 9) of the first overlay vernier mask pattern 210 (in FIG. 9) and an opening 232 corresponding to the opening 224 (in FIG. 9) of the second overlay vernier mask pattern 220 (in FIG. 9), and the opening 231 and the opening 232 serve as a first outer bar pattern and a second outer bar pattern, respectively.

Figure 13:
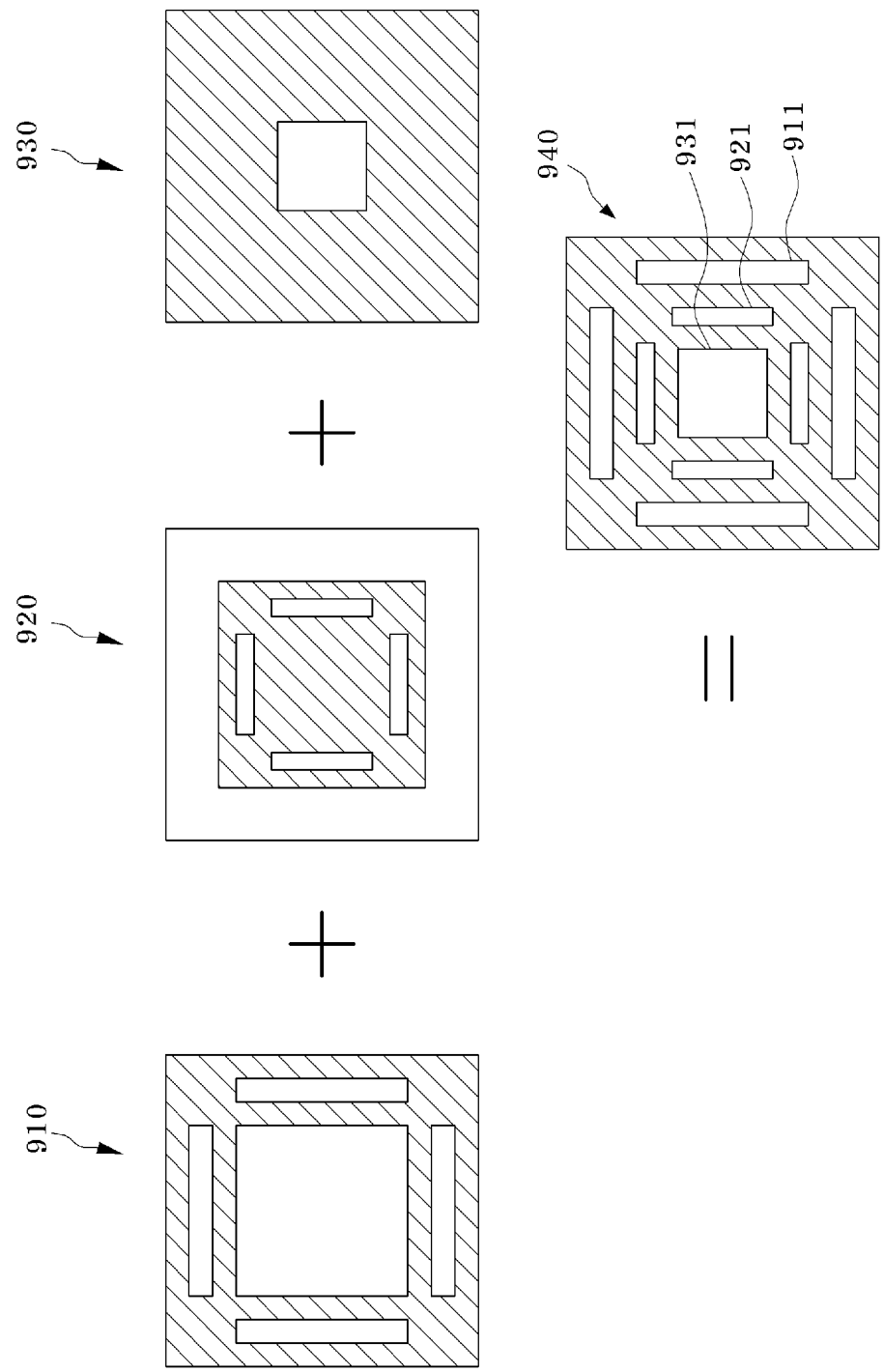
FIG. 13 is a diagram explaining a process of performing registration using an overlay vernier pattern formed according to an embodiment of the invention.

FIG. 13 is a diagram explaining a process of performing registration using an overlay vernier pattern formed according to an embodiment of the invention. Referring to FIG. 13, since a first overlay outer bar 910 is formed through an etching process using the first overlay vernier mask pattern 210 (in FIG. 1), which is formed in the first patterning process of the dual patterning process, as an etching mask, the first overlay outer bar 910 is formed in the same shape as that of the first overlay vernier mask pattern 210 (in FIG. 1). Similarly to this, since a second overlay outer bar 920 is formed through an etching process using the second overlay vernier mask pattern 220 (in FIG. 2), which is formed in the second patterning process of the dual patterning process, as an etching mask, the second overlay outer bar 920 is formed in the same shape as that of the second overlay vernier mask pattern 220 (in FIG. 2).

An overlay inner box 930 of another layer formed above in a subsequent process is usually formed in a box shape. As described above, after the first overlay outer bar 910, the second overlay outer bar 920 and the overlay inner box 930 are formed, an alignment relationship among them can be recognized from a result obtained by allowing them to overlap one another as seen in the resulting pattern 940 in FIG. 13. That is, an interval between a box pattern 931 from the overlay inner box 930 and a bar pattern 911 from the first overlay outer bar 910, or an interval between the box pattern 931 from the overlay inner box 930 and a bar pattern 921 from the second overlay outer bar 920, may be in place so that the positions of the patterns formed in the first patterning process and the second patterning process can be recognized and an alignment relationship with layers formed in a subsequent process can also be recognized.

According to various embodiments of the invention, an opening of a first overlay vernier mask pattern does not overlap a second overlay vernier mask pattern and the first overlay vernier mask pattern does not overlap the second overlay vernier mask pattern, so that it is possible to perform an etching process for forming an overlay vernier pattern.

Various embodiments of the present invention have been disclosed above for illustrative purposes. Those skilled in the art will appreciate that various modifications, additions, and substitutions are possible, without departing from the scope and spirit of the invention as disclosed in the accompanying claims.

What is claimed is:

1. An overlay vernier mask pattern of a semiconductor device, comprising:
a first overlay vernier mask pattern having a first opening for exposing a first area of a layer to be etched and a second opening for exposing a second area spaced apart from the first area, wherein the first opening of the first overlay vernier mask pattern has a box shape; and
a second overlay vernier mask pattern aligned on the first overlay vernier mask pattern and the layer to be etched, and having an opening for exposing the second opening while exposing a portion of the layer to be etched in the first area.

2. The overlay vernier mask pattern of claim 1, wherein the layer to be etched includes an amorphous carbon layer (ACL) and a silicon oxynitride layer (SiON).

3. The overlay vernier mask pattern of claim 1, wherein the first overlay vernier mask pattern includes a polysilicon layer.

4. The overlay vernier mask pattern of claim 1, wherein the second opening of the first overlay vernier mask pattern has a bar shape while being aligned in parallel to each side of the first opening.

5. The overlay vernier mask pattern of claim 1, wherein the second overlay vernier mask pattern includes an insulation layer formed by a spin-on coating (SOC) method.

6. The overlay vernier mask pattern of claim 1, wherein a portion of the second overlay vernier mask pattern overlaps the first overlay vernier mask pattern between the first opening and the second opening.

7. The overlay vernier mask pattern of claim 1, wherein the opening of the second overlay vernier mask pattern is aligned in the first area.

8. A semiconductor device comprising:
a substrate including a cell area and an overlay vernier area;
a layer to be etched aligned on the substrate;
a first cell mask pattern and a second cell mask pattern aligned on the layer to be etched of the cell area;
a first overlay vernier mask pattern having a first opening for exposing a first area of a layer to be etched of the overlay vernier area and a second opening for exposing a second area spaced apart from the first area, wherein the first cell mask pattern and the first overlay vernier mask pattern each includes a respective polysilicon pattern; and
a second overlay vernier mask pattern aligned on the first overlay vernier mask pattern and the layer to be etched of the overlay vernier area, and having an opening for exposing the second opening while exposing a portion of the layer to be etched in the first area.

9. The semiconductor device of claim 8, wherein the first cell mask pattern and the first overlay vernier mask pattern each includes a respective material pattern, which are substantially equal to each other.

10. The semiconductor device of claim 8, wherein the second cell mask pattern and the second overlay vernier mask pattern each includes a respective material pattern, which are substantially equal to each other.

11. The semiconductor device of claim 8, wherein the second cell mask pattern and the second overlay vernier mask pattern each includes a respective SOC pattern.

12. A method for forming an overlay vernier mask pattern of a semiconductor device, comprising:
   forming a first overlay vernier mask pattern on a layer to be etched on a substrate by performing a first patterning process of a dual patterning process, the first overlay vernier mask pattern having a first opening for exposing a first area of the layer to be etched and a second opening for exposing a second area spaced apart from the first area, wherein the first opening of the first overlay vernier mask pattern is formed in a box structure and the second opening of the first overlay vernier mask pattern and the opening of the second overlay vernier mask pattern are each formed in a bar structure; and
   forming a second overlay vernier mask pattern by performing a second patterning process of the dual patterning process, the second overlay vernier mask pattern having an opening for exposing the second opening on the first overlay vernier mask pattern and the layer to be etched while exposing a portion of the layer to be etched in the first area.

13. A method for forming a semiconductor device, comprising:
   forming a layer to be etched on a substrate including a cell area and an overlay vernier area;
   forming a first mask layer on the layer to be etched;
   forming a first cell mask pattern and a first overlay vernier mask pattern in the cell area and the overlay vernier area by patterning the first mask layer through a first patterning process of a dual patterning process, the first overlay vernier mask pattern having a first opening for exposing a first area of the layer to be etched and a second opening for exposing a second area spaced apart from the first area;
   forming a second mask layer on the first cell mask pattern and the first overlay vernier mask pattern;
   forming a second cell mask pattern in the cell area where the first cell mask pattern and the second cell mask pattern are alternately aligned, and forming a second overlay vernier mask pattern in the overlay vernier area by patterning the second mask layer through a second patterning process of the dual patterning process, the second overlay vernier mask pattern having an opening for exposing the second opening while exposing a portion of the layer to be etched in the first area; and
   removing an exposed portion of the layer to be etched by using the first cell mask pattern, the second cell mask pattern, the first overlay vernier mask pattern, and the second overlay vernier mask pattern as etching masks, thereby forming a cell mask pattern and an overlay vernier pattern in the cell area and the overlay vernier area, respectively.

14. The method of claim 13, wherein the layer to be etched is formed by sequentially stacking an amorphous carbon layer, a first silicon oxynitride layer, a first polysilicon layer, and a second silicon oxynitride layer.

15. The method of claim 14, wherein the first mask layer includes a material having a sufficient etching selectivity relative to the second silicon oxynitride layer to perform as an etch buffer layer to the second silicon oxynitride layer.

16. The method of claim 15, wherein the first mask layer includes a second polysilicon layer.

17. The method of claim 14, wherein the second mask layer includes a material having a sufficient etching selectivity relative to the second silicon oxynitride layer to perform as an etch buffer layer to the second silicon oxynitride layer.

18. The method of claim 17, wherein the second mask layer includes an amorphous carbon layer.

19. The method of claim 13, wherein the first opening and the second opening of the first overlay vernier mask pattern have a box structure and a bar structure, respectively.

20. The method of claim 13, wherein the opening of the second overlay vernier mask pattern has a bar structure.

21. The method of claim 13, wherein the opening of the second overlay vernier mask pattern overlaps the first opening of the first overlay vernier mask pattern.

* * * * *